(12) United States Patent
Matsuzawa

(10) Patent No.: US 6,576,149 B1
(45) Date of Patent: Jun. 10, 2003

(54) METHOD AND DEVICE FOR PARTING LAMINATED SUBSTRATE FOR LIQUID CRYSTAL CELL

(75) Inventor: Tadashi Matsuzawa, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 138 days.

(21) Appl. No.: 09/612,220

(22) Filed: Jul. 7, 2000

(30) Foreign Application Priority Data

Jul. 8, 1999 (JP) ............................................. 11-195029

(51) Int. Cl.$^7$ ............................................. C30B 33/00
(52) U.S. Cl. .............................. 216/23; 216/24; 216/31; 216/52; 438/460; 438/462; 438/464
(58) Field of Search ............................. 216/23, 24, 31, 216/52; 438/460, 462, 464, 690

(56) References Cited

U.S. PATENT DOCUMENTS

| | | | | |
|---|---|---|---|---|
| 5,492,582 A | * | 2/1996 | Ide et al. ..................... 156/101 |
| 5,551,618 A | * | 9/1996 | Shinozaki et al. ............. 225/93 |
| 5,622,540 A | * | 4/1997 | Stevens .................... 219/121.6 |
| 5,724,110 A | * | 3/1998 | Majima ....................... 349/153 |
| 5,785,225 A | | 7/1998 | Loomis |
| 5,818,556 A | * | 10/1998 | Havens et al. ............... 349/187 |
| 5,959,098 A | * | 9/1999 | Goldberg et al. .............. 435/5 |
| 6,140,044 A | | 10/2000 | Besemer et al. |
| 6,205,994 B1 | | 3/2001 | Freund et al. |
| 6,211,991 B1 | * | 4/2001 | Bryan ........................ 156/230 |
| 6,284,631 B1 | * | 9/2001 | Henley et al. ............... 438/458 |
| 6,307,042 B1 | * | 10/2001 | Goldberg et al. .............. 435/6 |

FOREIGN PATENT DOCUMENTS

| | | | | |
|---|---|---|---|---|
| JP | 02-279532 | * | 11/1990 | ......... C03B/33/033 |
| JP | 10-170880 | | 6/1998 | |
| JP | 11-090900 | * | 4/1999 | ............ B26F/3/04 |
| KR | 74-387 | | 11/1994 | |

* cited by examiner

Primary Examiner—Randy Gulakowski
Assistant Examiner—M. Kornavov
(74) Attorney, Agent, or Firm—Foley & Lardner

(57) ABSTRACT

A method for parting a laminated substrate used for a liquid crystal cell and a parting device are provided which are capable of obtaining, at a time of the parting, a parting line being vertical to a face on which a scribe line is formed, thus enabling prevention of a failure in the parting of the laminated substrate.

To part the laminated substrate made of a first substrate and a second substrate into a plurality of substrates used for the liquid crystal cell, the scribe line is formed on one substrate out of the first substrate and second substrate along a boundary of the substrate used for the liquid crystal cell and multiple parting force is applied by timesharing to the other substrate out of the first and second substrates along the scribe line.

16 Claims, 14 Drawing Sheets

- 13; breaking member
- 14; fixed cylinder

FIG.7

| shortest distance | conventional technology 1 | present invention | conventional technology 2 |
|---|---|---|---|
| A | 2 | 1 | 2 |
| B | 0.5 | 0 | 0.5 |
| C | 0.5 | 0 | 0.5 |
| D | 3.5 | 2 | 3 |
| E | 0.5 | 0 | 0.5 |

METHOD AND DEVICE FOR PARTING LAMINATED SUBSTRATE FOR LIQUID CRYSTAL CELL

BACKGROUND OF THE INVENTION

1. Field of the Invention

The present invention relates to a method and a device for parting a laminated substrate used for a liquid crystal cell, which can be suitably employed for manufacturing, for example, a liquid crystal display device.

2. Description of the Related Art

Generally, a process of manufacturing a liquid crystal display is classified roughly into three processes including a process of fabricating a color filter substrate and an array substrate (for example, Thin Film Transistor or TFT), a process of forming a cell containing a lamination of both fabricated substrates and a process of constructing a module into which a driver used for driving a cell or the like is embedded.

The lamination of the substrates contained in the processes of forming the cell is performed after processes including washing following a fabrication of each substrate, application of orientation films, rubbing, coating with sealing materials and mounting of a spacer are complete.

Since a large size substrate that can be chamfered on multiple faces is used to improve productivity in the processes, the large size substrate obtained after the lamination has to be parted, depending on a size of a product, into a plurality of substrates that can be used as liquid crystal cells.

FIGS. 10A and 10B are perspective views explaining a conventional method for parting the laminated substrate used for the liquid crystal cell. FIGS. 11A and 11B are front views explaining a scribing process and a breaking process in the conventional method for parting the laminated substrate used for the liquid crystal cell. As shown in FIGS. 10A and 10B and 11A and 11B, in the conventional method for parting the laminated substrate, when a laminated substrate 103, obtained by laminating a first substrate 101 on to a second substrate 102, is parted into a plurality of substrates that can be used as the liquid crystal cell, parting is performed, after a scribe line 101a (scribed groove) is formed on one of the two substrates constituting the laminated substrate 103, for example, on the substrate 101, by a parting force applied at one time to the other substrate, for example, on the substrate 102, in a position being directly above the scribe line 101a along a line being parallel to the scribe line 101a, using a squeegee 105.

However, the conventional method for parting the laminated substrate presents a problem in that, since the parting force has to be applied at one time, to the laminated substrate 103, the application of a comparatively large parting force is required for parting the laminated substrate 103. As a result, as shown in FIGS. 12A and 12B, when the laminated substrate 103 is parted, a parting line 106, due to a residual stress occurring after the formation of a pattern (sealing pattern) 107 in a pre-working process, cannot be made vertical to a face on which the scribe line 101a is formed and is bent on a side of the scribe line 101a, which thus causes a failure in the parting of the laminated substrate 103. Moreover, though technology of a "method for parting a panel" is disclosed in Japanese Patent Application laid-open Hei1-170880, it cannot solve the above problem because the parting process disclosed in the Application is performed by using "parting power applied at one time to a laminated substrate in a position being deviated by a predetermined distance from a directly upward position of a scribe line".

SUMMARY OF THE INVENTION

In view of the above, it is an object of the present invention to provide a method for parting a laminated substrate used for a liquid crystal cell and a parting device being capable of obtaining, at a time of the parting, a parting line being vertical to a face on which a scribe line is formed, thus enabling prevention of failure in the parting.

According to a first aspect of the present invention, there is provided a parting method of a laminated substrate used for a liquid crystal cell for parting the laminated substrate which includes a first substrate and a second substrate into a plurality of substrates that can be used as the liquid crystal cell, including steps of:

forming a scribe line on one substrate out of the first substrate and second substrate along a boundary of the substrate used for the liquid crystal cell; and applying multiple parting force by timesharing to other substrate out of the first substrate and second substrate along the scribe line.

By configuring as above, since multiple parting force is applied by timesharing to the first substrate or second substrate providing for the laminated substance along the scribe line, it is possible to obtain a plurality of substrates used for the liquid crystal cell from the laminated substrates.

In the foregoing, a preferable mode is one wherein each parting force is applied sequentially from a start position in a direction of the scribe line to an end position in the direction of the scribe line.

By configuring as above, the parting of the laminated substrate is performed by individual parting force applied sequentially from the start position in the direction of the scribe line to the end position in the direction of the scribe line.

Also, a preferable mode is one wherein a process of inverting the laminated substrate exists between a process of forming the scribe line and a process of applying the parting force.

By configuring as above, the parting of the laminated substrate is performed by the scribe line formed on one substrate out of the first substrate and second substrate along the boundary of the substrate used for the liquid crystal cell and by multiple parting force applied, after the laminated substrate is inverted, to other substrate out of the first substrate and second substrate along the scribe line.

According to a second aspect of the present invention, there is provided a parting device of a laminated substrate used for a liquid crystal cell, including:

a scribing mechanism having an adsorption table to hold the laminated substrate including of two substrates and having a cutter used to form a scribe line on one substrate constituting the laminated substrate staying on the adsorption table; and a breaking mechanism having an adsorption table to hold the laminated substrate staying in the scribing mechanism with it being inverted and having a breaking member to apply multiple parting force by timesharing to other substrate being the laminated substrate staying on the adsorption table along a direction of the scribe line.

By configuring as above, at the time of parting the laminated substrate, the scribe line is formed on one substrate constituting the laminated substrate using the cutter of the scribing mechanism and then multiple parting force is applied by timesharing to other substrate being the laminated substrate using the breaking member of the breaking mechanism along the scribe line.

In the foregoing, a preferable mode is one wherein the breaking member includes a plurality of flat squeegees operated to move by driving of a fixed cylinder.

By configuring as above, when each of fixed cylinders is driven, each flat squeegee is moved and multiple parting force is applied by timesharing to other substrate being the laminated substrate.

Furthermore, a preferable mode is one wherein the breaking mechanism includes of a single circular squeegee operated to vibrate by driving of a moving cylinder.

By configuring as above, when the moving cylinder is driven and moved, the circular squeegee is vibrated and multiple parting force is applied by timesharing.

BRIEF DESCRIPTION OF THE DRAWINGS

The above and other objects, advantages and features of the present invention will be more apparent from the following description taken in conjunction with the accompanying drawings in which:

FIG. 7 is a table explaining, with the aim of evaluation, a difference in methods for parting the laminated substrate used for the liquid crystal cell between the conventional technology and the present invention;

DETAILED DESCRIPTION OF THE PREFERRED EMBODIMENTS

Figure 1A:
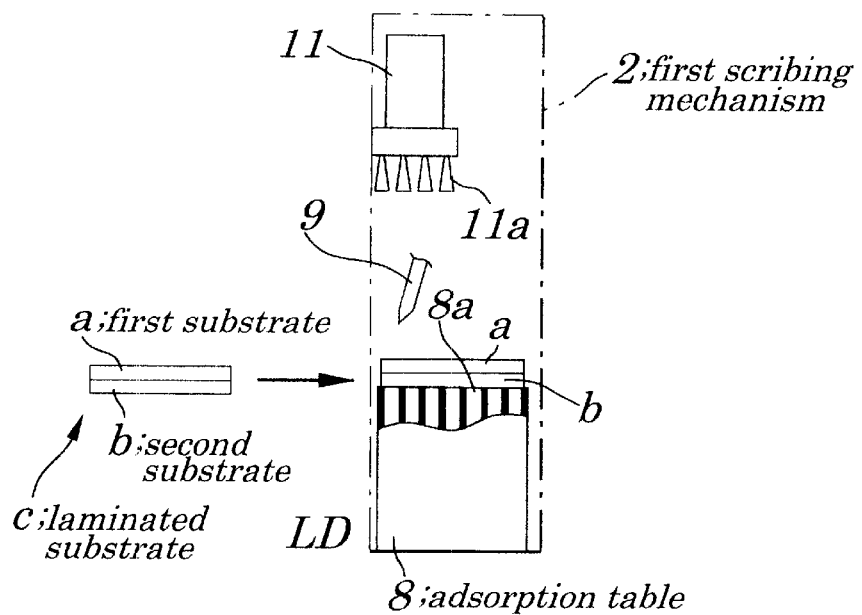
FIGS. 1A to 1F are front views showing a device for parting a laminated substrate used for a liquid crystal cell according to a first embodiment of the present invention.

Best modes of carrying out the present invention will be described in further detail using various embodiments with reference to the accompanying drawings.

First Embodiment

FIGS. 1A to 1F are front views showing a device for parting a laminated substrate used for a liquid crystal cell according to a first embodiment. As shown in FIGS. 1A to 1F, the device for parting a laminated substrate c (overlapped substrate) includes of a first scribing mechanism 2, a first inverting mechanism 3, a first breaking mechanism 4, a second scribing mechanism 5, a second inverting mechanism 6 and a second breaking mechanism 7.

The first scribing mechanism 2 has an adsorption table 8 and a cutter 9. The adsorption table 8 is fixed positionally relative to a reference face within the first scribing mechanism 2. An air inlet 8a connected to a vacuum pump (not shown) is mounted on the adsorption table 8. The laminated substrate c obtained by laminating a first substrate a (TFT substrate) and a second substrate b (opposed substrate) is held on the adsorption table 8 in a state of being adsorbed, with its first substrate a disposed in an upper place and with its second substrate b disposed in a lower place.

Figure 2A:
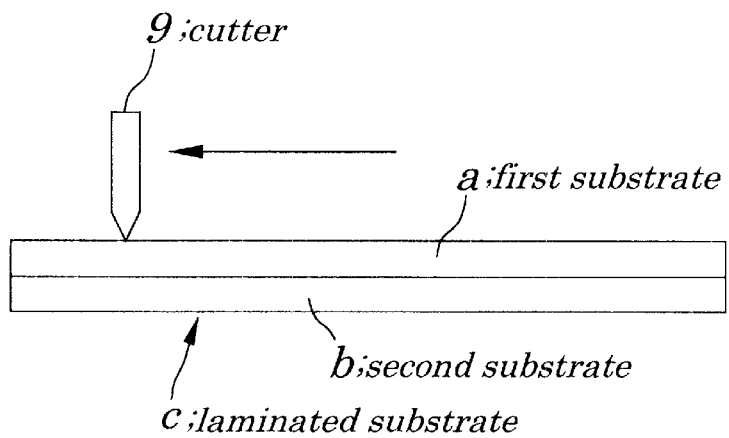
FIG. 2A is a front view and FIG. 2B is a perspective view both of which show a scribing process in a method for parting the laminated substrate used for the liquid crystal cell according to the first embodiment of the present invention.
Figure 2B:
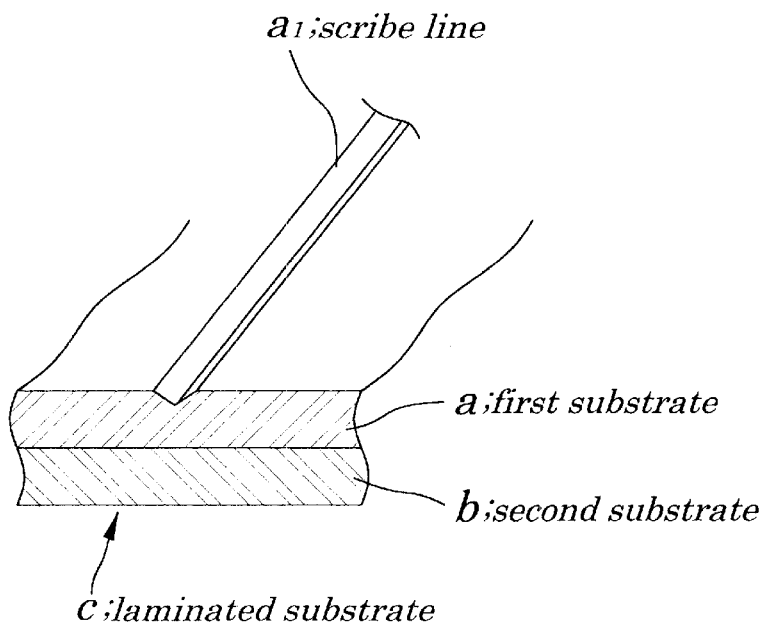

The cutter 9 is placed above the adsorption table 8 in a manner so as to be moved freely. The whole cutter 9 is made of a sintered carbide material such as diamond, sapphire or a like. When the cutter 9 is moved as shown in FIG. 2A, a scribe line $a_1$ is formed on the laminated substrate (first substrate a) on the adsorption table 8 along a boundary of a substrate that can be used as the liquid crystal cell (not shown).

Figure 1B:
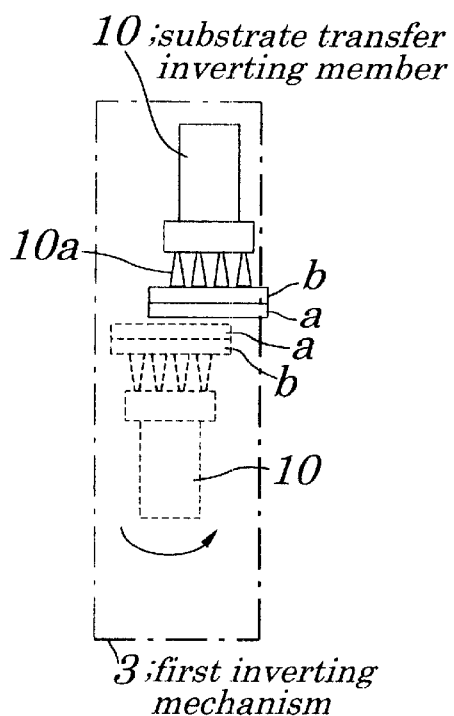

The first inverting mechanism 3 has a substrate transfer inverting member 10 and is disposed on an unloader (ULD) side of the first scribing mechanism 2. The substrate transfer inverting member 10 includes a substrate holder disposed between the first inverting mechanism 3 and the first breaking mechanism 4 in a manner so as to be inverted and moved. On the substrate transfer inverting member 10 is mounted an adsorption pad 10a that can adsorb the laminated substrate c (second substrate b). The substrate transfer inverting member 10, as indicated by phantom lines in FIG. 1B, is adapted to adsorb the laminated substrate c with its second substrate b disposed in the lower place and then to be inverted by a motor (not shown) so that its second substrate b is disposed in the upper place.

Between the ULD and the first scribing mechanism 2 and between the first scribing mechanism 2 and the first inverting mechanism 3, the laminated substrate c is conveyed by a substrate conveying member 11. The substrate conveying member 11 has an adsorption pad 11a which is mounted in a state where it can move in an up/down and right/left direction at an upper place above the adsorption table 8.

The first breaking mechanism 4 has an adsorption table 12 and a breaking member 13, which is displaced on the ULD side of the first inverting mechanism 3. The adsorption table 12 is fixed positionally relative to a reference face within the first breaking mechanism 4. The adsorption table 12 is provided with an air inlet 12a connected to the vacuum pump (not shown). The laminated substrate c is held on the adsorption table 12 in a state of being adsorbed, with its second substrate b disposed in the upper place and with its first substrate a disposed in the lower place.

Figure 3A:
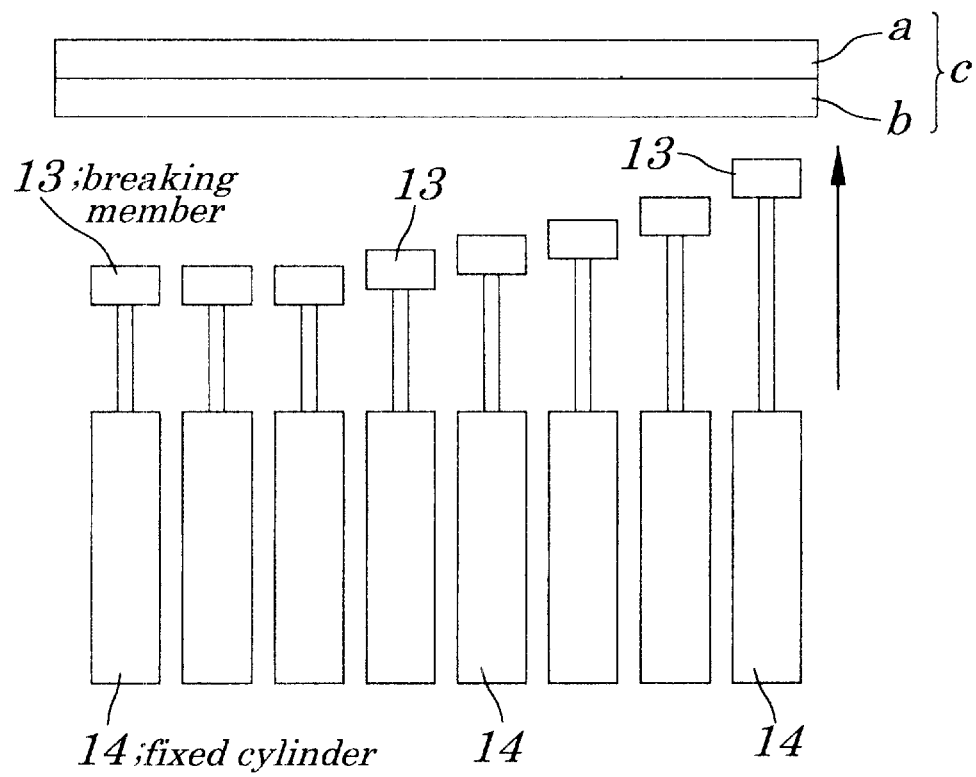
FIG. 3A is a front view and FIG. 3B is a perspective view both of which show a breaking process in the method for parting the laminated substrate used for the liquid crystal cell according to the first embodiment of the present invention.
Figure 3B:
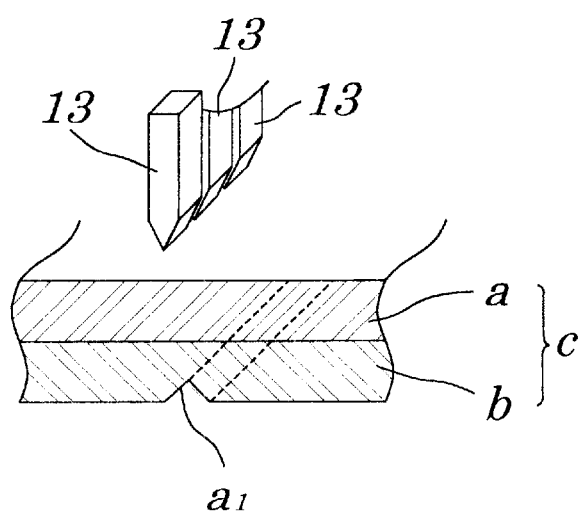

The breaking member 13 includes, for example, eight (six in FIG. 1C) flat squeegees each being adapted to move by a corresponding fixed cylinder totally made of synthetic resin such as Teflon (trade name), Viton (trade name) or a like, and is disposed at an upper place above the adsorption table 12 in a state where it can ascend and descend freely. As shown in FIGS. 3A and 3B, this causes multiple parting force to be applied from each of the breaking members 13 moved by timeshared driving of the fixed cylinder 14 to the second substrate b at a time of parting of the laminated substrate c. Between the first breaking mechanism 4 and the first inverting mechanism 3, the laminated substrate c is conveyed by the substrate transfer inverting member 10.

Configurations of the second scribing mechanism 5, second inverting mechanism 6 and second breaking mechanism 7 are almost the same as those of the first scribing mechanism 2, first inverting mechanism 3 are first breaking mechanism 4 and detailed descriptions of them are omitted accordingly. The laminated substrate c is held on the second scribing mechanism 5 in an adsorbed state, with its second substrate b disposed in the upper place and its first substrate a disposed in the lower place. Moreover, a scribe line (not shown) is formed by the cutter 9 on the second substrate b of the laminated substrate c on the adsorption table 8 along a boundary of a substrate that can be used as the liquid crystal cell (not shown).

Figure 1C:
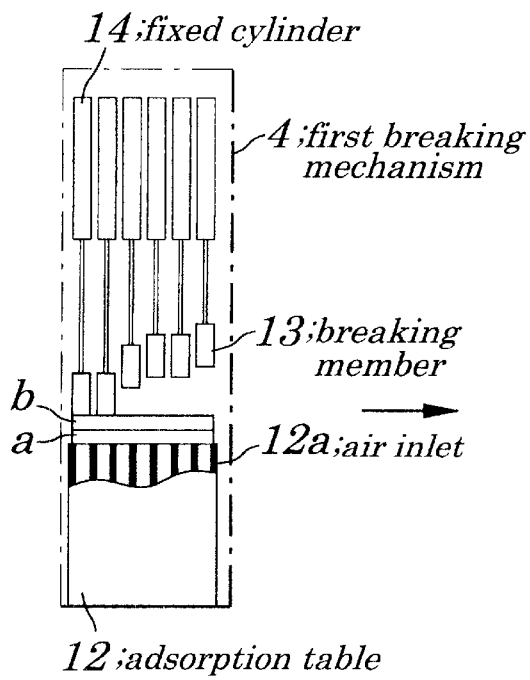
Figure 1D:
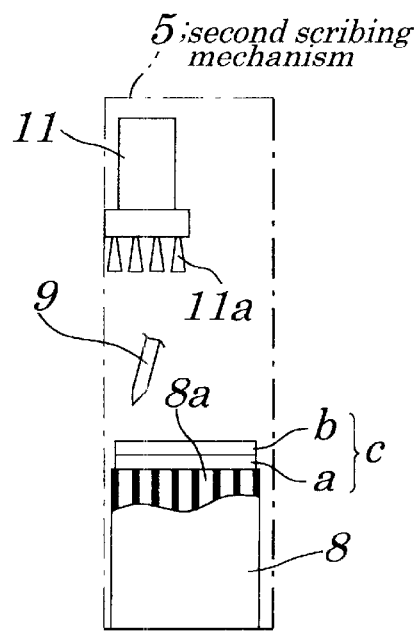
Figure 1E:
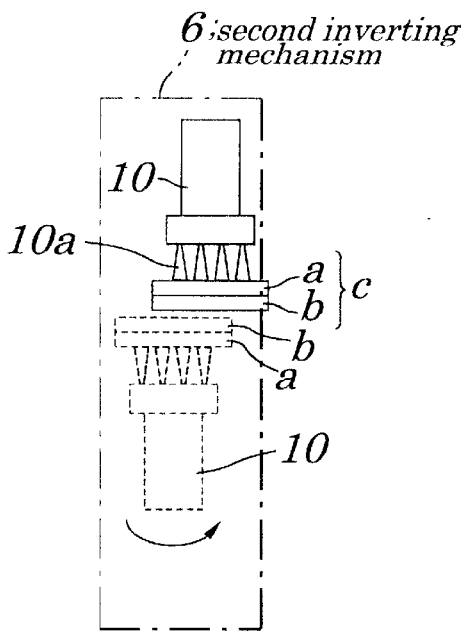

The substrate transfer inverting member 10 of the second inverting mechanism 6, after having adsorbed the laminated substrate c with its second substrate b disposed in the upper place and with its first substrate a disposed in the lower place as shown by phantom lines in FIG. 1E, is adapted to be inverted by a motor (not shown) in a manner that the first substrate a is displaced at an upper place as shown by solid lines in FIG. 1E. Between the first breaking mechanism 4 and the second scribing mechanism 5 and between the second scribing mechanism 5 and the second inverting mechanism 6, the laminated substrate c is conveyed by the substrate conveying member 11. The laminated substrate c is held by the adsorption table 12 of the second breaking mechanism 7 in the adsorbed state with its first substrate a disposed in the upper place and with its second substrate b disposed in the lower place. Moreover, multiple parting force is applied from each of the breaking members 13 moved by timeshared driving of the fixed cylinder 14 to the first substrate a at a time of parting the second substrate b. Between the second breaking mechanism 7 and the second inverting mechanism 6, the laminated substrate c is conveyed by the substrate transfer inverting member 10. Then, when the laminated substrate c is conveyed to the ULD side by the substrate conveying member 11, the adsorption is cleared by the adsorption pad 11a and a broken material $c_1$ is dislodged.

Figure 4:
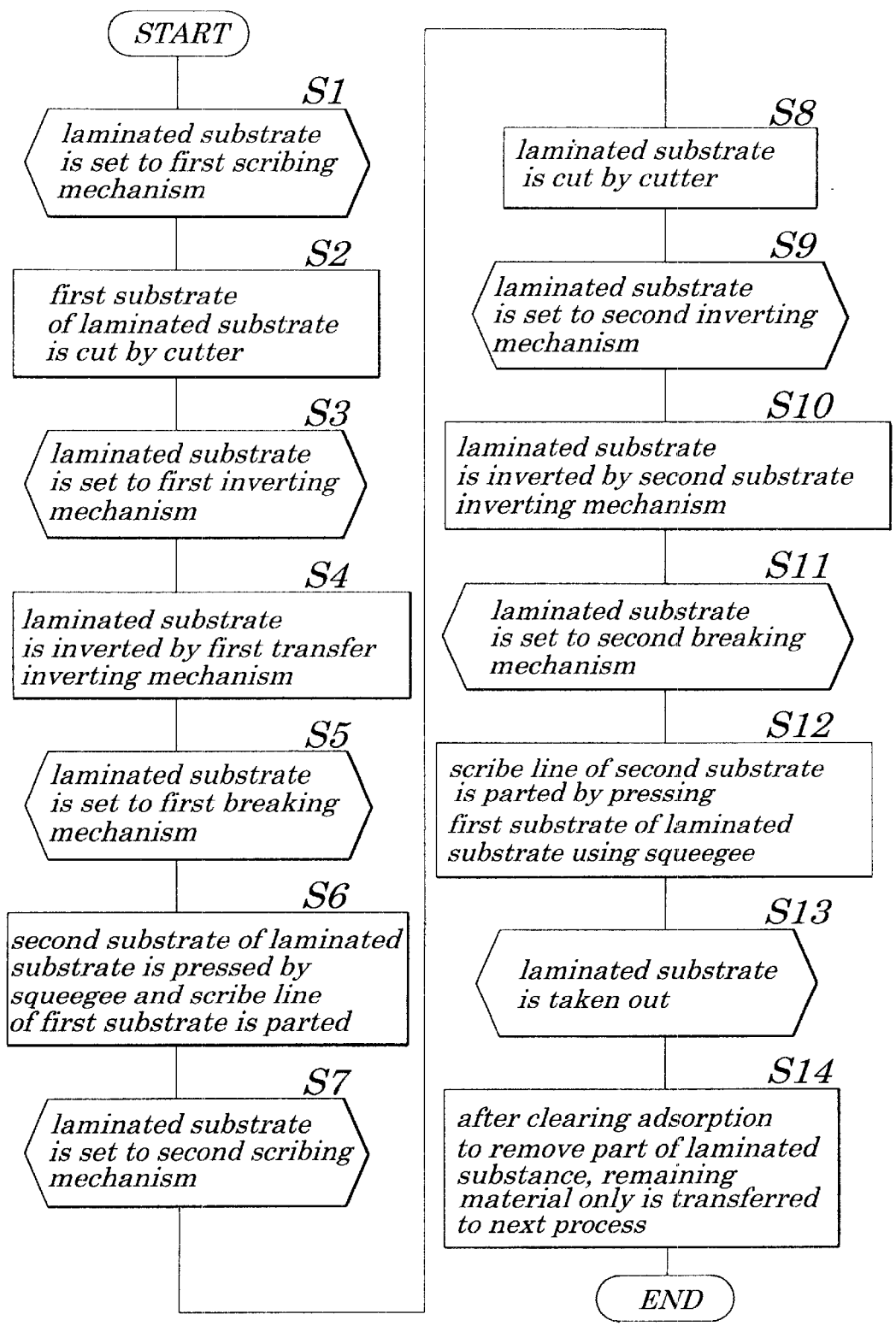
FIG. 4 is a chart flow explaining the method for parting the laminated substrate used for the liquid crystal cell according to the first embodiment of the present invention.

Next, a method for parting the laminated substrate c of the embodiment will be described by referring to FIGS. 1A to 1F and FIG. 4. FIG. 4 is a chart flow explaining the method for parting the laminated substrate c used for the liquid crystal cell according to the first embodiment. Parting of the laminated substrate a used for the liquid crystal cell of this embodiment is performed, in order, through a first scribing process, a first inverting process, a first breaking process, a second scribing process, a second inverting process and a second breaking process.

First, the first scribing process is described below. The laminated substrate c is conveyed by the substrate conveying member 11 to the adsorption table 8 in the first scribing mechanism 2 from the loader side, with its first substrate a disposed in the upper place and with its second substrate b disposed in the lower place. As shown in FIG. 1A, the laminated substrate c is fixed on the adsorption table 8 in an adsorbed state. Then, after forming a scribing line $a_1$ along the boundary of the substrate used in the liquid crystal cell by cutting a surface of the first substrate a (as shown in FIG. 5) at a pressure of 0.1 kg/cm$^2$ to 0.8 kg/cm$^2$ using a cutter 9 (Step S2 in FIG. 4), the adsorption of the laminated substrate c by the adsorption table 8 is cleared.

Next, the first inverting process is described below. As shown by phantom lines in FIG. 1B, the laminated substrate c is conveyed to the substrate transfer inverting member 10 in the first inverting mechanism 3 by the substrate conveying member 11 with its first substrate a disposed in the upper place and with its second substrate b disposed in the lower place.

After the laminated substrate c is held on the substrate transfer inverting member 10 in an adsorbed manner (Step S3 in FIG. 4), as shown in solid lines in FIG. 1, the laminated substrate c is inverted by the substrate transfer member 10 so that its second substrate b and its first substrate a are disposed in the upper and lower places respectively (Step S4 in FIG. 4).

Next, the first breaking process is described below. The laminated substrate c, after its second substrate b and its first substrate a are disposed at the upper and lower places respectively by the substrate transfer inverting member 10, is conveyed to the adsorption table 12 in the first breaking mechanism 4. Then, the laminated substrate c is held in an adsorbed state on the adsorption table (Step S5 in FIG. 4).

As shown in FIG. 1C, each of breaking members 13 is moved by timeshared driving of each fixed cylinder 14 (at an interval of 10 ms to 40 ms) and multiple parting force is applied to the second substrate b along the scribe line $a_1$ (Step S6 in FIG. 4). At this point, parting of the first substrate a is carried out by sequentially applying individual parting force (0.5 kg/cm$^2$ to 2.0 kg/cm$^2$) toward an end position in a line direction from a start position in the line direction.

The second scribing process is described below. As shown in FIG. 1D, the laminated substrate c is conveyed by the substrate conveying member 11 from the first breaking mechanism 4 to the adsorption table 8 in the second scribing mechanism 5, with its second substrate b disposed in the upper place and its first substrate a disposed in the lower place. Then, the laminated substrate c is fixed to the adsorption table 8 in an adsorbed state (Step S7 in FIG. 4).

Figure 6:
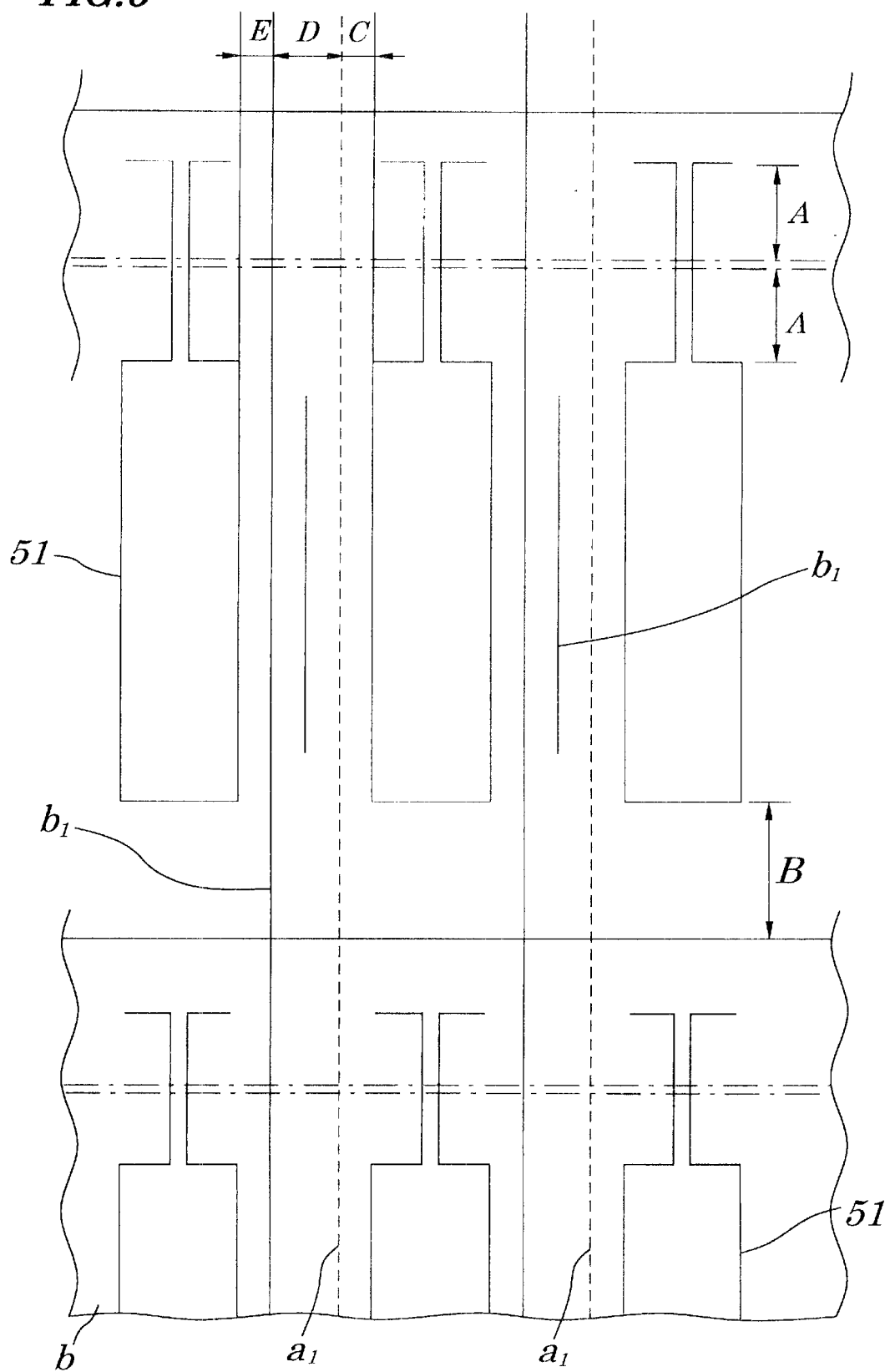
FIG. 6 is a top view explaining, with an aim of evaluation, a difference in methods for parting the laminated substrate used for the liquid crystal cell between a conventional technology and the present invention.

Then, after forming a scribing line $b_1$ along the boundary of the substrate used in the liquid crystal cell by cutting a surface of the second substrate b (as shown in FIG. 6) at a pressure of 0.1 kg/cm$^2$ to 0.8 kg/cm$^2$ using a cutter 9 (Step S8 in FIG. 4), the adsorption of the laminated substrate c by the adsorption table 8 is cleared.

The second inverting process is described below. As shown by phantom lines in FIG. 1E, the laminated substrate c is conveyed by the substrate conveying member 11 to the substrate transfer inverting member 10 in the second inverting mechanism 6 with the second substrate b disposed in the upper place and the first substrate a in the lower place.

Next, after the laminated substrate c is fixed to the substrate transfer inverting member 10 in the adsorbed state (Step S9 in FIG. 4), as shown by solid lines in FIG. 1E, the laminated substrate c is inverted so that the first substrate a is disposed in the upper place and the second substrate b is disposed in the lower place (Step S10 in FIG. 4).

Figure 1F:
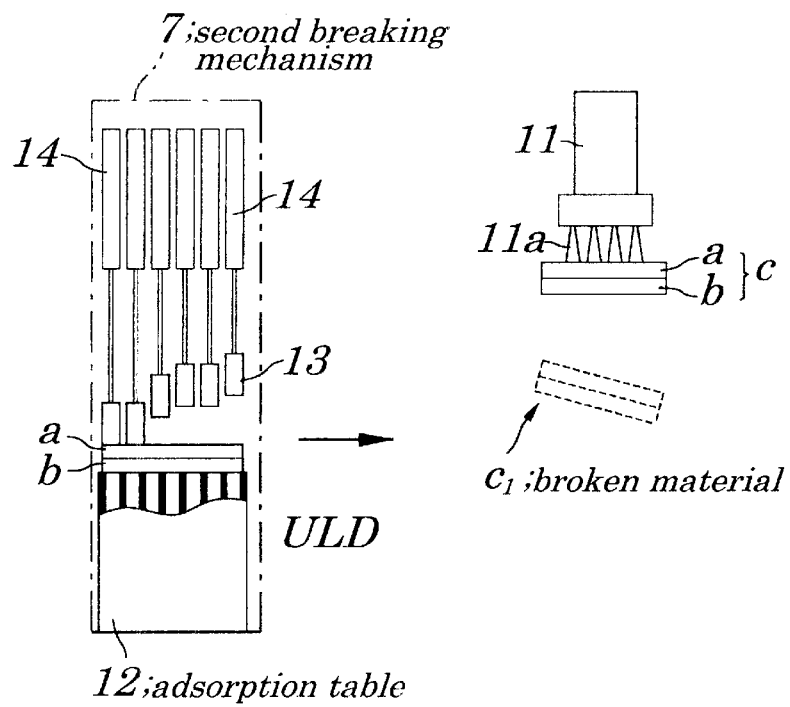

The second breaking process is described below. First, the laminated substrate c is conveyed by the substrate transfer inverting member 10 to the adsorption table 12 in the second breaking mechanism 7 with the first substrate a disposed at the upper place and the second substrate b disposed at the lower place. The laminated substrate c is fixed on the adsorption table 12 in the adsorbed state (Step S11 in FIG. 4). As shown in FIG. 1F, each breaking member 13 is moved by timeshared driving of each fixed cylinder 14 (at an interval of 10 to 40 ms) and multiple parting force is applied to the first substrate a along the scribe line $b_1$ (Step S12 in FIG. 4). At this point, the parting of the second substrate b is carried out by sequentially applying each parting force (0.5 kg/cm$^2$ to 2.0 kg/cm$^2$) toward an end position in a line direction from a start position in the line direction.

Then, the adsorption of the laminated substrate c by the adsorption table 12 is cleared and the laminated substrate c is conveyed by the adsorption force of the substrate conveying member 11 to the ULD side from the second breaking mechanism 7 (Step S13 in FIG. 4). Then, a part (broken materials $c_1$) of the laminated substrate c is removed by clearing the adsorption by the substrate conveying member 11 and the remaining materials only are transferred to the next process (Step S14 in FIG. 4).

Figure 5A:
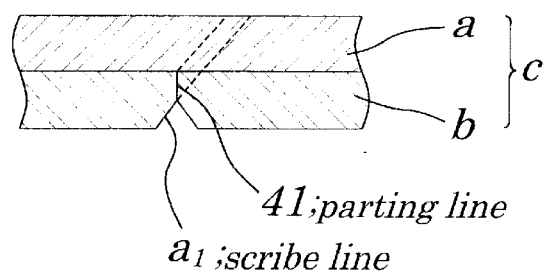
FIG. 5A is a cross-sectional view and FIG. 5B is a top view, both of which show the laminated substrate obtained by parting in accordance with the parting method according to the first embodiment of the present invention.
Figure 5B:
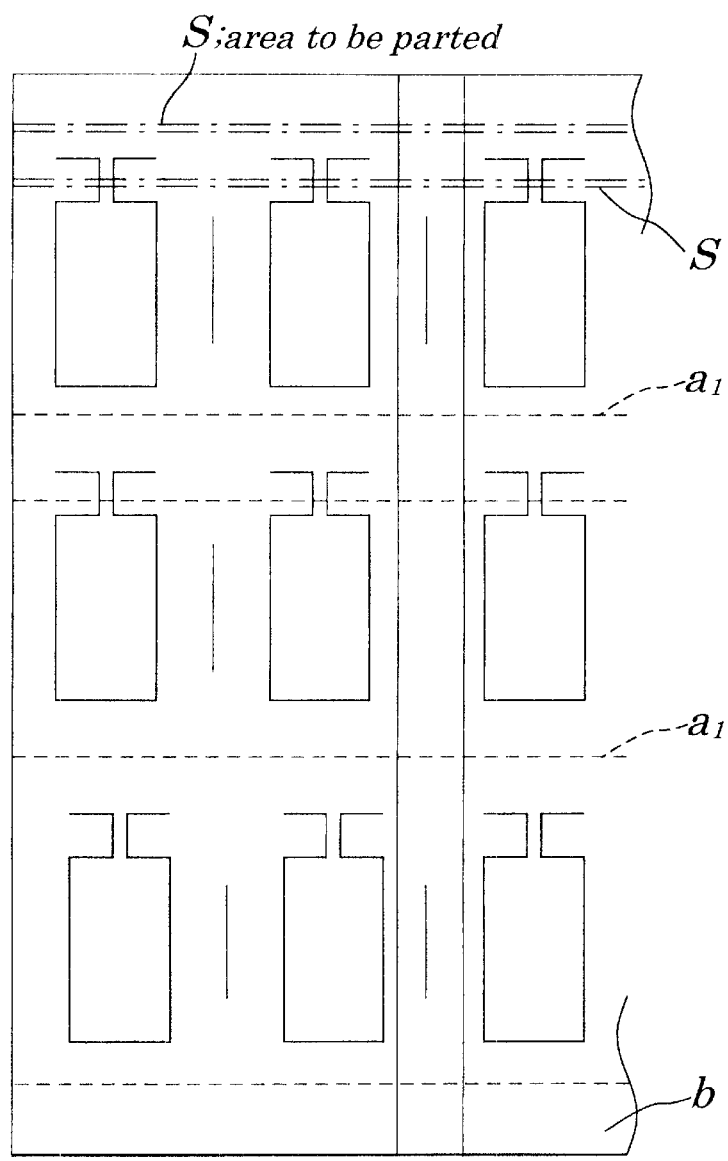

According to the first embodiment, since the parting of the laminated substrate c is carried out by forming the scribe line $a_1$, for example, on the first substrate a, out of the first substrate a and the second substrate b, along the boundary of the substrate used for the liquid crystal cell and by applying multiple parting force by timesharing, along a next scribe line $a_1$, unlike in the conventional technology, large parting force at one time is not required and, as shown in FIG. 5A and FIG. 5B, parting line $a_1$ 41 being vertical to a face on which the scribe line is formed can be obtained for the whole scribe line (area S to be parted).

Moreover, according to the first embodiment, as described above, since no large parting force at one time is required for parting the laminated substrate c and since the distance between a seal pattern 51 used for the liquid crystal cell and the scribe line $a_1$ and scribe line $b_1$ can be made small as shown in FIG. 6, many liquid crystal cell substrates can be obtained from a single laminated substrate c and dimensions of the product can be made small as well.

When the laminated substrate c was parted by using methods of the present invention, the conventional technology 1 (in which the parting force was applied at one time at a position directly above the scribe line) and the conventional technology 2 (in which the parting force was applied at one time at a position being deviated by a predetermined distance from the position directly above the scribe line). Shortest distances A to E in which the parting between the seal pattern 51 and the scribe line $a_1$ and scribe line $b_1$ were made possible was measured, results as shown in FIG. 7 were obtained.

Second Embodiment

A second embodiment of the present invention will be described hereafter by referring to FIGS. 8A to 8F. FIGS. 8A to 8F are front views showing a device for parting a laminated substrate used for a liquid crystal cell according to a second embodiment. The same reference numbers in FIGS. 8A to 8F as those in FIG. 1 designate corresponding parts and descriptions of their configurations will be omitted. In FIGS. 8A to 8F, a parting device for a laminated substrate c used for the liquid crystal cell includes a first scribing mechanism 2, a first inverting mechanism 3, a first breaking mechanism 82, a second scribing mechanism 5, a second inverting mechanism 6 and a second breaking mechanism 83. The first breaking mechanism 82 has an adsorption table 12 and a breaking member 84, which are mounted on an ULD side of the first inverting mechanism 3. The breaking member 84 connected to a guide mechanism L (ascending/descending shafts $L_1$ and $L_2$) at an upper place of the adsorption table 12 includes a single circular squeegee which vibrates, ascends and descends by driving of a moving cylinder 85 and which is totally made of synthetic resins such as Teflon, Viton or a like. An edge of the breaking member 84 contacting with the laminated substrate c has a shape with a predetermined curvature and an edge on the moving cylinder 85 side is provided with a through window 84a in which the direction of the squeegee width is its direction of the length.

Figure 9:
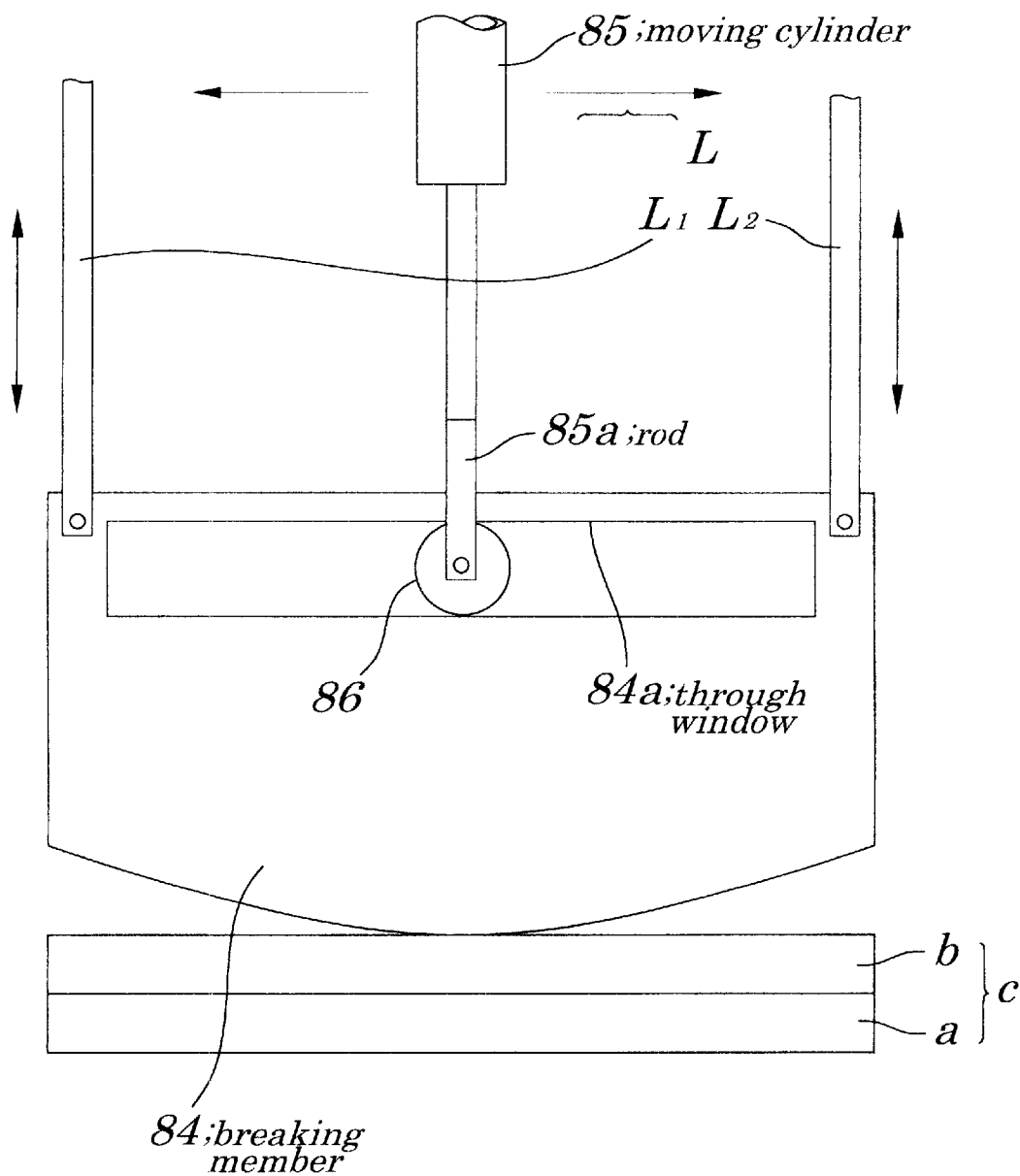
FIG. 9 is a front view explaining a breaking process in a method for parting the laminated substrate used for the liquid crystal cell according to the second embodiment of the present invention.
Figure 10A:
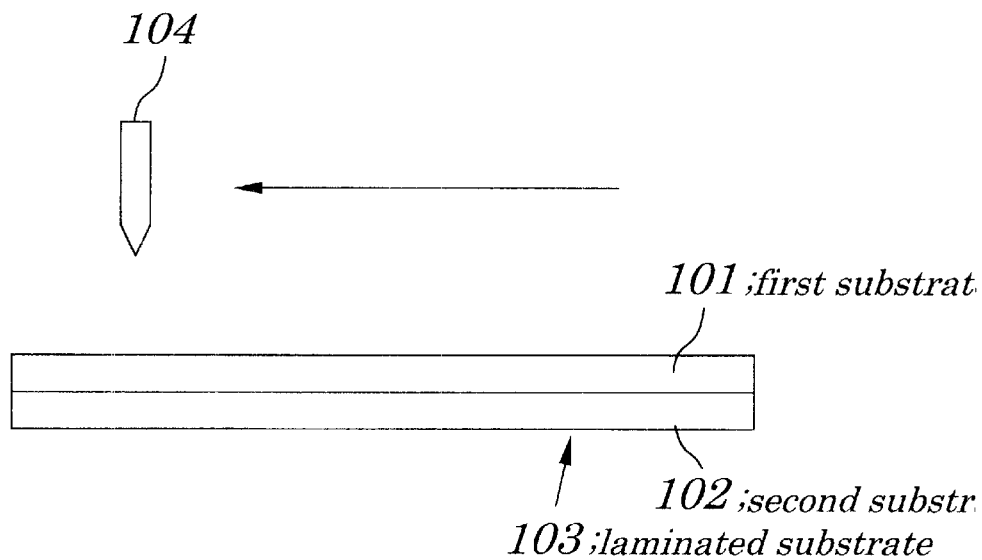
FIGS. 10A and 10B are perspective views explaining a conventional method for parting a laminated substrate (overlapped substrate) for a liquid crystal cell.
Figure 10B:
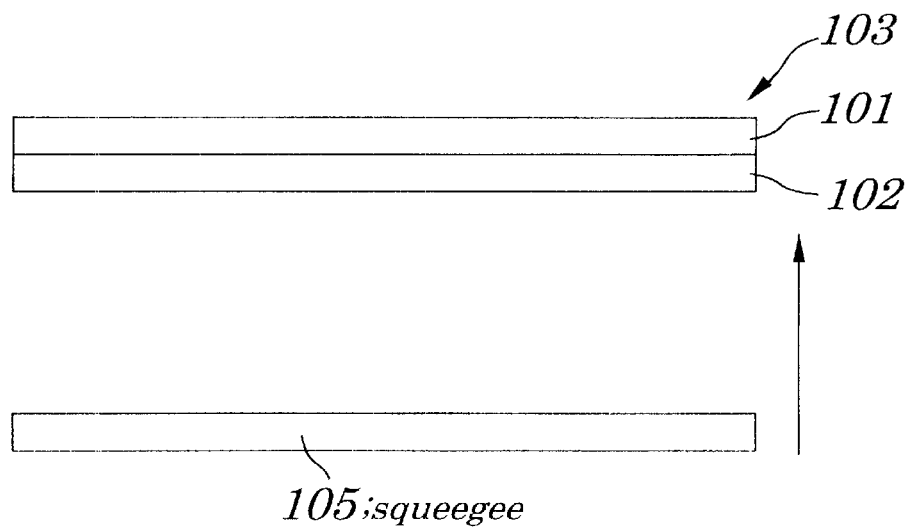
Figure 11A:
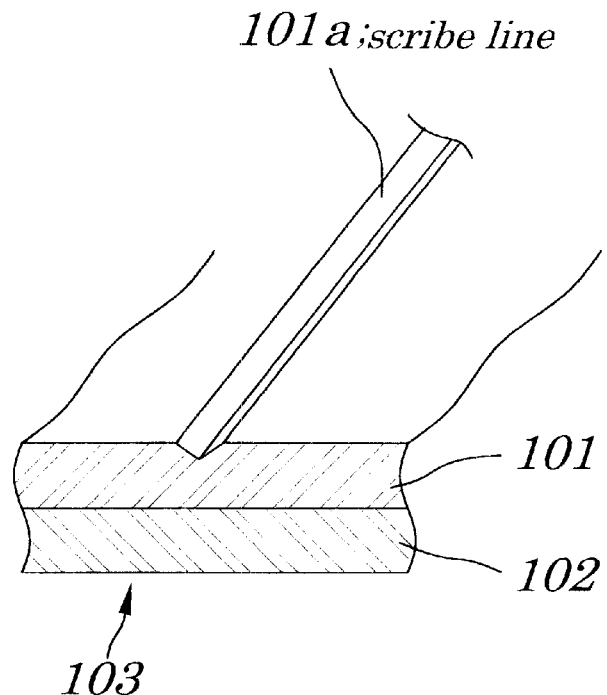
FIGS. 11A and 11B are front views explaining a scribing process and a breaking process in the conventional method for parting the laminated substrate for the liquid crystal cell.
Figure 11B:
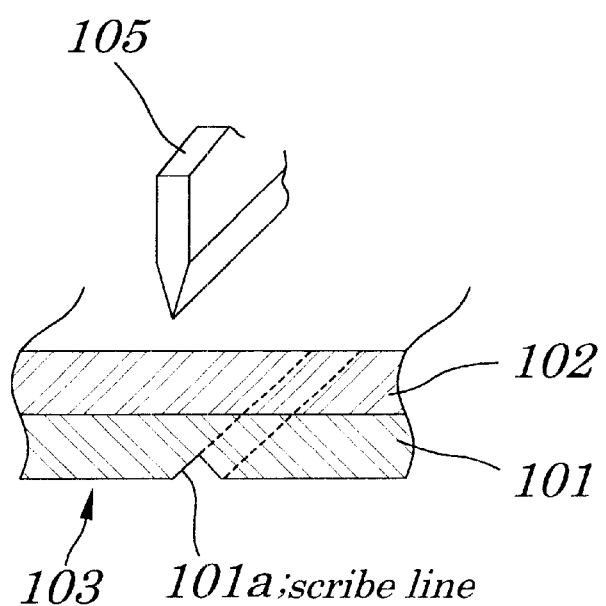
Figure 12A:
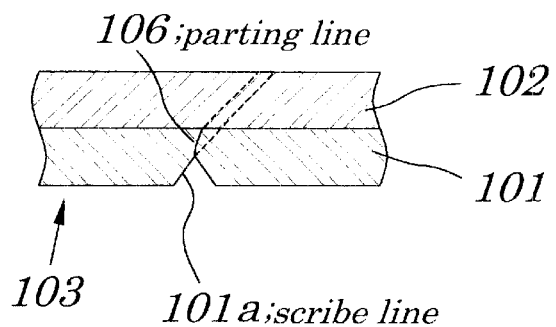
FIG. 12A is a cross-sectional view and FIG. 12B is a top view, both of which show the laminated substrate obtained after being parted by the conventional method for parting the laminated substrate used for the liquid crystal cell.
Figure 12B:
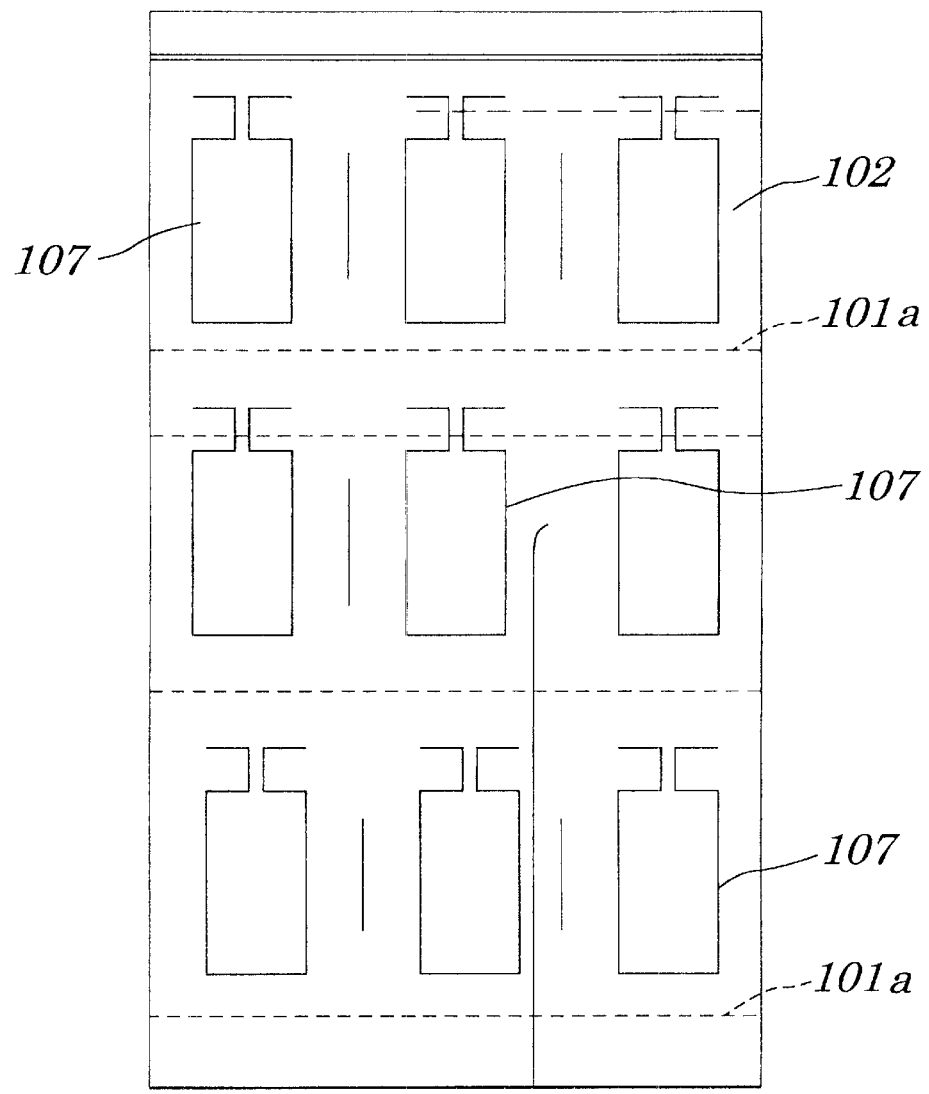

The moving cylinder 85 includes the moving cylinder 85 moving in an up/down direction and in a scribe line direction and has a rod 85a moving in an up/down direction. In an end portion of the rod 85a of the moving cylinder 85 is mounted a roller 86 which can roll within the through window 84a. At a time of parting the laminated substrate c (first substrate a), multiple parting force is applied from the breaking member 84 to the second substrate b along a scribe line $a_1$ when the moving cylinder 85 is moved in a scribe line direction (in a right/left direction in FIG. 9) and is driven in synchronization with movement.

Moreover, in the above embodiment, the breaking member 84 adapted to vibrate by ascending and descending movements of the ascending/descending shaft L1 and L2 at the time of driving by the moving cylinder 85 is used, however, another type of the breaking member 84 which vibrates around the shaft (not shown) inserted into a center of the curvature may be used as well.

Configurations of the second breaking mechanism 83 are same as those of the first breaking mechanism 82 and therefore their descriptions are omitted. The laminated substrate c is held in an absorbed manner with its first substrate a disposed at an upper place and with its second substrate b disposed at a lower place. Moreover, at a time of parting the second substrate b, multiple parting force is applied from the breaking member 84 along the scribe line $b_1$ to the first substrate a by timesharing.

Next, the method for parting the laminated substrate c according to this embodiment will be described below. The parting of the laminated substrate c used for the liquid crystal cell of this embodiment, as in the case of the first embodiment, is carried out, in order, through a first scribe process, a first inverting process, a first breaking process, a second scribing process, a second inverting process and a second breaking process. Of them, the first scribing process, first inverting process, second scribing process and second inverting process of this embodiment are same as those in the first embodiment and therefore descriptions of these processes are omitted. Descriptions of the first breaking process and second breaking process will be described below.

Figure 8A:
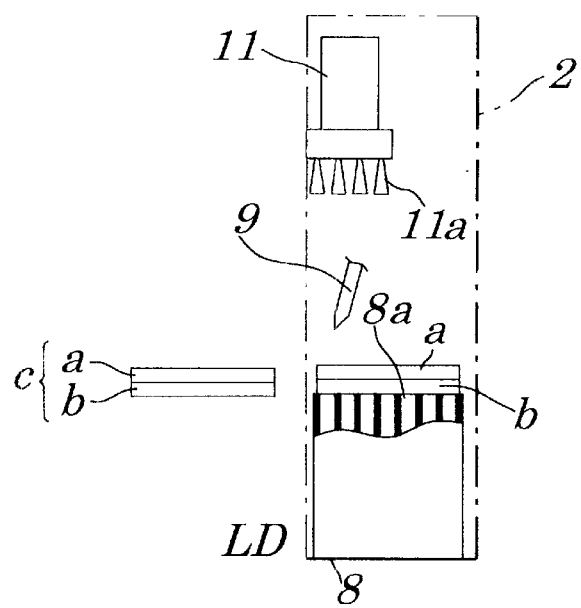
FIGS. 8A to 8F are front views showing a device for parting a laminated substrate used for a liquid crystal cell according to a second embodiment of the present invention.
Figure 8B:
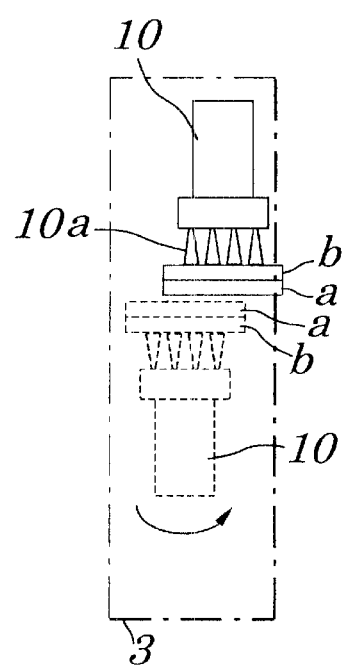
Figure 8C:
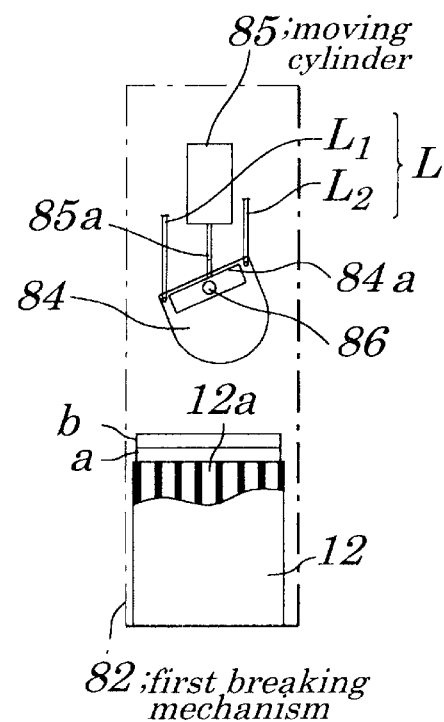
Figure 8D:
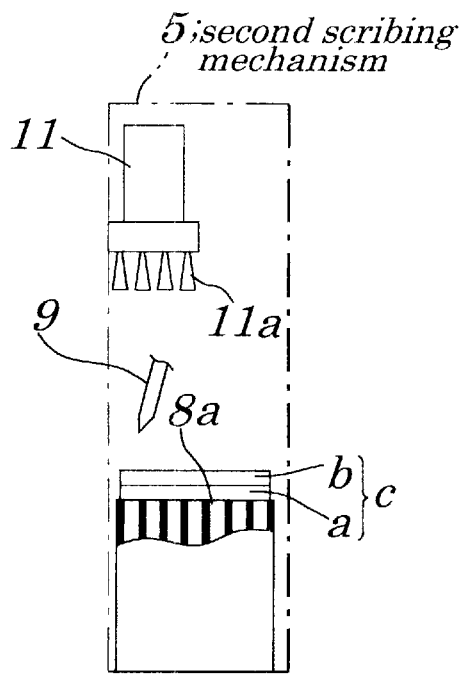
Figure 8E:
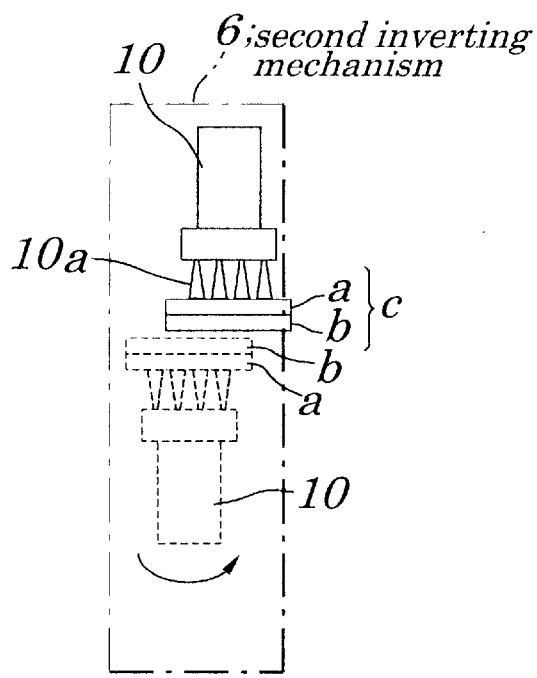

First, the first breaking process will be described. The laminated substrate c is conveyed, with its second substrate b disposed at the upper place and with its first substrate a disposed at the lower place, by the substrate transfer inverting member 10 to the adsorption table 12 of the first breaking mechanism 82. Then, the laminated substrate c is fixed on the adsorption table 12 in an adsorbed state. As shown in FIG. 8C, by moving the moving cylinder 85 in direction of the scribe line at a speed of 10 mm/sec to 300 mm/sec and by driving the rod 85a and moving it toward the laminated substrate c, that is, by vibrating the breaking member 84, multiple parting force is applied to the second substrate b along the scribe line $a_1$ by timesharing (at intervals of 10 ms to 40 ms). At this point, the parting of the first substrate a is performed by individual parting force (0.5 kg/cm$^2$ to 2.0 kg/cm$^2$) applied from a start position in direction of the scribing line $a_1$ to an end position of the scribing line $a_1$ direction.

The second breaking process will be described below. First, the laminated substrate c is conveyed by the substrate transfer inverting member 10 to the adsorption table 12 in the second breaking mechanism 83, with its first substrate a disposed at the upper place and with its second substrate b disposed at the lower place. Next, the laminated substrate c is fixed on the adsorption table 12 in an adsorbed state.

Figure 8F:
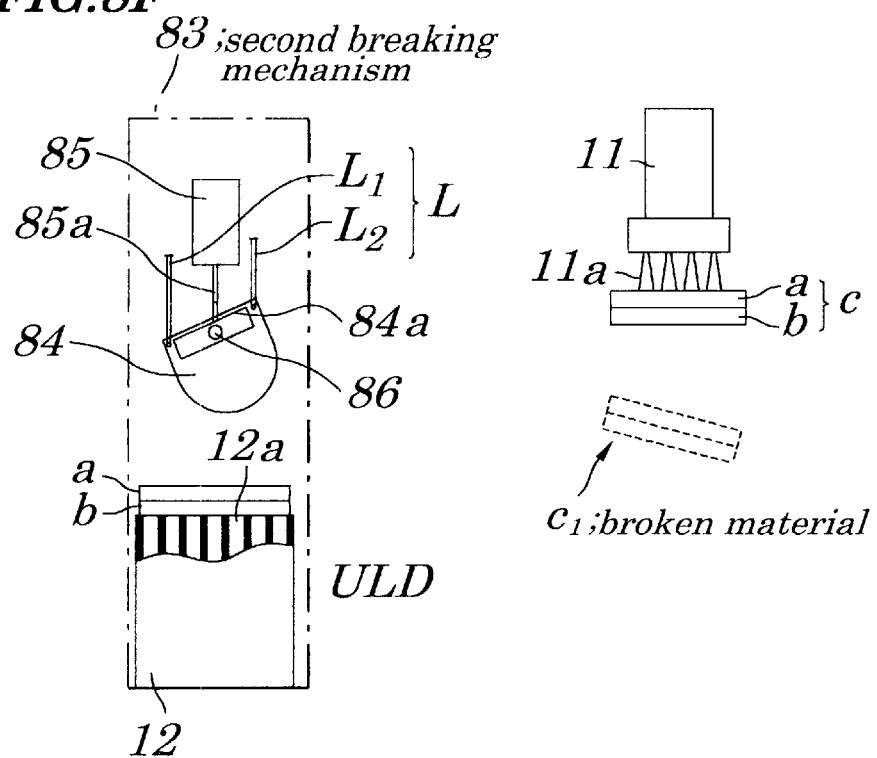

As shown in FIG. 8F, by moving the moving cylinder 85 in the direction of the scribe line at a speed of 10 mm/sec to 300 mm/sec and by driving the rod 85a and moving it toward the laminated substrate c, that is, by vibrating the breaking member 84, multiple parting force is applied to the first substrate a along the scribe line $a_1$ by timesharing (at intervals of 10 ms to 40 ms). At this point, parting of the second substrate b is performed by individual parting force (0.5 kg/cm$^2$ to 2.0 kg/cm$^2$) applied from the start position in the direction of the scribing line $b_1$ to an end position of the scribing line $b_1$ direction.

Therefore, according to this embodiment, as in the case of the first embodiment, since no large parting force at one time is required for parting the laminated substrate c, a parting line being vertical to a face on which the scribe line is formed can be obtained for the whole scribe line, many liquid crystal cell substrates can be obtained from the single laminated substrate c and dimensions of the product can be made small as well.

As described above, according to the present invention, unlike in the conventional technology, since the scribe line is formed on one substrate out of the first and second substrates along the boundary of the substrate used for the liquid crystal cell and multiple parting force is applied by timesharing to the other substrate out of the first substrate and second substrate, no large parting force at one time is required for parting the laminated substrate. As a result, the parting line being vertical to the face on which the scribing line is formed at the time of parting of the laminated substrate, thus preventing the occurrence of parting failures in the laminated substrate.

Moreover, since no large parting force at one time is required for parting the laminated substrate, distance between the seal pattern used for the liquid crystal cell and each scribe line can be set to a small dimension, which allows many substrates used for the liquid crystal cell to be obtained from the single laminated substrate and product dimensions to be made smaller, thus enabling reduction of production cost and miniaturization of product.

It is apparent that the present invention is not limited to the above embodiments but may be changed and modified without departing from the scope and spirit of the invention. For example, in each of the embodiments described above, two scribing mechanisms, two inverting mechanisms and two breaking mechanisms are mounted in each process, however, one scribing mechanism, one inverting mechanism and one breaking mechanism can be used in common in two processes. Moreover, according to the present invention, no limitation is posed on a cross-sectional configuration of the breaking member and therefore the cross-sectional configuration of its contacting profile (side profile) may have a circular arc shape, direct line (of about 1 mm to 10 mm) shape or kinked curve shape (of an acute angle).

Finally, the present application claims the priority of Japanese Patent Application No. Hei11-195029 filed on Jul. 8, 1999, which are herein incorporated by reference.

What is claimed is:

1. A parting method of a laminated substrate used for a liquid crystal cell for parting the laminated substrate composed of a first substrate and a second substrate into a plurality of substrates for the liquid crystal cell, comprising steps of:

forming a scribe line on said first substrate along a boundary of said substrate for said liquid crystal cell; and applying multiple parting forces from multiple breaking members by timesharing application of said multiple breaking members to said second substrate along said scribe line to part said scribe line, each of said multiple parting forces being smaller than a force required to part said liquid crystal cells from the laminated substrate at one time.

2. The parting method according to claim 1, wherein each of said parting forces is applied sequentially from a start position in a direction of said scribe line to an end position in said direction of said scribe line.

3. The parting method according to claim 1, wherein a process of inverting said laminated substrate exists between a process of forming said scribe line and a process of applying said parting forces.

4. The parting method according to claim 2, wherein a process of inverting said laminated substrate exists between a process of forming said scribe line and a process of applying said parting forces.

5. The parting method according to claim 1, further comprising steps of:

forming another scribe line on said first substrate along a boundary of said substrate for said liquid crystal cell; and applying said multiple parting forces from multiple breaking members by timesharing application of said multiple breaking members to said first substrate along said another scribe line to part said another scribe line.

6. A method of parting a plurality of liquid crystal cells from a single laminated substrate composed of a first substrate and a second substrate, comprising the steps of:

forming a scribe line on said first substrate along a boundary of said liquid crystal cells, applying a plurality of parting forces at different times on said second substrate along said scribe line to break said scribe line, forming another scribe line on said second substrate along a boundary of said liquid crystal cells, and applying said parting forces at different times on said first substrate along said scribe line to break said another scribe line, wherein each of said parting forces is smaller than a force required to part the cells from the laminated substrate at one time.

7. A method of parting a laminated substrate composed of a first substrate and a second substrate, comprising the steps of:

forming a scribe line on said first substrate; and applying multiple parting forces from multiple breaking members by timesharing application of said multiple breaking members to said second substrate along said scribe line to break said scribe line, each of said multiple parting forces being smaller than a force required to part said laminated substrate at one time.

8. The parting method according to claim 7, wherein each of said multiple parting forces is applied sequentially from a start position in a direction of said scribe line to an end position in said direction of said scribe line.

9. The parting method according to claim 7, wherein a process of inverting said laminated substrate exists between a process of forming said scribe line and a process of applying said multiple parting forces.

10. The parting method according to claim 8, wherein a process of inverting said laminated substrate exists between a process of forming said scribe line and a process of applying said multiple parting forces.

11. The parting method according to claim 7, further comprising the steps of:

forming another scribe line on said second substrate; and applying said multiple parting forces on said first substrate along said another scribe line to break said another scribe line.

12. A method of parting a plurality of liquid crystal cells from a laminated substrate composed of a first substrate and a second substrate, comprising the steps of:

forming a scribe line on said first substrate along a boundary of said liquid crystal cells; and applying multiple parting forces from a curved articulating breaking member by timesharing application of said multiple parting forces to said second substrate along said scribe line to break said scribe line, each of said multiple parting forces being smaller than a force required to part said laminated substrate at one time.

13. The parting method according to claim 12, wherein each of said multiple parting forces is applied sequentially from a start position in a direction of said scribe line to an end position in said direction of said scribe line.

14. The parting method according to claim 12, wherein a process of inverting said laminated substrate exists between a process of forming said scribe line and a process of applying said multiple parting forces.

15. The parting method according to claim 13, wherein a process of inverting said laminated substrate exists between a process of forming said scribe line and a process of applying said multiple parting forces.

16. The parting method according to claim 12, further comprising the steps of:

forming another scribe line on said second substrate along a boundary of said liquid crystal cells, and applying said multiple parting forces on said first substrate along said another scribe line to break said another scribe line.

* * * * *

UNITED STATES PATENT AND TRADEMARK OFFICE
CERTIFICATE OF CORRECTION

PATENT NO.    : 6,576,149 B1
DATED         : June 10, 2003
INVENTOR(S)   : Tadashi Matsuzawa It is certified that error appears in the above-identified patent and that said Letters Patent is hereby corrected as shown below:

Title page,
Item [56], References Cited, FOREIGN PATENT DOCUMENTS, insert:
-- JP 59-8632      01/17/1984
   JP 9-278473    10/28/1997 --

Signed and Sealed this

Fourteenth Day of October, 2003

JAMES E. ROGAN
*Director of the United States Patent and Trademark Office*